United States Patent [19]
Angel et al.

[11] 3,944,912
[45] Mar. 16, 1976

[54] MAGNETIC DETECTION MEANS FOR SENSING MOBILE FERROMAGNETIC MASSES INCLUDING PULSE SHAPER CIRCUIT FOR GENERATING A SINGLE PULSE OUTPUT

[75] Inventors: Yves Angel, Sceaux; Duc Mai Van Duc, Saint-Denis, both of France

[73] Assignee: U.S. Philips Corporation, New York, N.Y.

[22] Filed: Jan. 11, 1973

[21] Appl. No.: 322,632

[30] Foreign Application Priority Data
Feb. 4, 1972 France .................. 72.03787

[52] U.S. Cl. .............. 324/41; 307/261; 324/8; 340/38 L
[51] Int. Cl.² .................. G01R 33/00; G01R 33/12
[58] Field of Search ............ 324/41, 43 R, 4, 8; 340/38 L; 307/261, 268; 328/26, 28, 32

[56] References Cited
UNITED STATES PATENTS

| | | | |
|---|---|---|---|
| 2,406,870 | 9/1946 | Vacquier | 324/8 |
| 2,570,870 | 10/1951 | Schmitt et al. | 324/43 R |
| 2,696,602 | 12/1954 | Evans | 324/8 |
| 2,807,720 | 9/1957 | Charles | 324/41 |
| 2,938,164 | 5/1960 | Hansburg | 324/43 R |
| 3,218,547 | 11/1965 | Ling | 324/47 |
| 3,458,802 | 7/1969 | Koerner | 324/41 |
| 3,649,958 | 5/1972 | Koerner | 340/38 L |

*Primary Examiner*—Robert J. Corcoran
*Attorney, Agent, or Firm*—Frank R. Trifari; Bernard Franzblau

[57] ABSTRACT

A device for detecting mobile ferromagnetic masses, notably of vehicles, comprising a magnetometric pick-up element of the type with orthogonal fields. The pick-up element is a ferrite tube of small dimensions which is provided with a toroidal pump winding and a solenoid signal winding. The output of the processing and amplifying device for the signal of the pick-up element is fed back to the solenoid winding via a circuit comprising a low-pass filter and a symmetrical current amplifier. A pulseshaper for the amplified signal supplied by the pick-up element comprises phase-shifting circuits, so that a single squarewave pulse can be obtained upon the passage of a metallic mass.

14 Claims, 5 Drawing Figures

MAGNETIC DETECTION MEANS FOR SENSING MOBILE FERROMAGNETIC MASSES INCLUDING PULSE SHAPER CIRCUIT FOR GENERATING A SINGLE PULSE OUTPUT

The invention relates to a device for detecting mobile ferromagnetic masses, notably vehicles, comprising a pick-up element for indicating the local variations of permanent magnetic fields at the area of the pick-up which are caused by the passage of the said ferromagnetic masses, a device for processing and amplifying the signal supplied by the pick-up, and a pulse shaper which is designed such that it supplies a single pulse upon the passage of each ferromagnetic mass.

A detector of this kind is used, for example, for counting vehicles travelling on a road.

Some of the known vehicle detectors use an inductive loop as a pick-up element, the said loop forming part of the oscillatory circuit of an oscillator whose frequency is changed by the passage of a vehicle in the vicinity of this loop. A drawback of this system is that the loop, which is to be embedded in the road, generally has comparatively large dimensions so that it is fragile and expensive to install. In addition, the nature of the soil and the climatic conditions have a disturbing effect on the signal supplied by the detector.

An object of the invention is to eliminate these drawbacks by utilizing and adapting the principles of a magnetometer with orthogonal, winding for the detection of vehicles.

One of the objects of the invention is to provide a detector which is very sensitive to the passage of ferromagnetic masses but insensitive to intefering parameters and which comprises a robust pick-up element, is economical, has very small dimensions, and can be arranged in the most favourable location in or at the edge of the road.

According to the invention a detector for ferromagnetic mobile masses, more particularly automotive vehicles, is characterized in that the pick-up element is an element of the type with orthogonal windings, comprising an element which is made of a ferromagnetic material and which is provided with a pump winding which is supplied with a current of a frequency $f_p$ which saturates the said material, and with a signal winding which is orthogonal to the pump winding. The device for processing and amplifying the signal of the pick-up element comprises a cascade connection of a circuit for selecting an even harmonic of the frequency $f_p$ and a synchronous detector whose amplified output signal constitutes the output signal of the said processing and amplifying device.

The second harmonic, supplying the useful signal having the highest amplitude, is preferably chosen.

The ferromagnetic element of the pick-up is preferably a ferrite tube which is provided with a toroidal winding which serves as the pump winding, and a solenoid winding which serves as the signal winding. This tube is dimensioned, for example, 2 × 4 × 50 mm.

The permanent magnetic field in the vicinity of the pick-up element (essentially caused by the earth's magnetic field), however, does not always have the same value for each location where the pick-up element is arranged, and can even vary due to the presence of stationary vehicles. In other words, the zero value of the signal supplied by the amplifying device can vary so that it is difficult to extract information about the passage of vehicles therefrom.

Another object of the invention is to provide means for automatic neutralization of the permanent magnetic fields without substantially influencing the sensitivity of the said detector to variable fields caused by the passage of vehicles.

To achieve this end, according to the invention, the output signal of the processing and amplifying device is fed back to a solenoid winding of the pick-up element via a circuit comprising a low-pass filter and a symmetrical current amplifier.

This solenoid winding is preferably the signal winding.

At the output of the device for amplifying the signal of the pick-up element, a signal of variable shape and amplitude appears upon the passage of a vehicle, the said signal being capable of assuming the one or the other polarity.

Another object of the invention is to provide a pulse-shaper which, regardless of the signal, supplies a single squarewave pulse which can activate a counting device.

The following description, than with reference to the attached drawings, given by way of non-limitative example, will provide a better understanding as to how the invention can be realized, FIG. 1 shows the diagram of the detector according to the invention with the exception of the pulseshaper.

Figure 1:
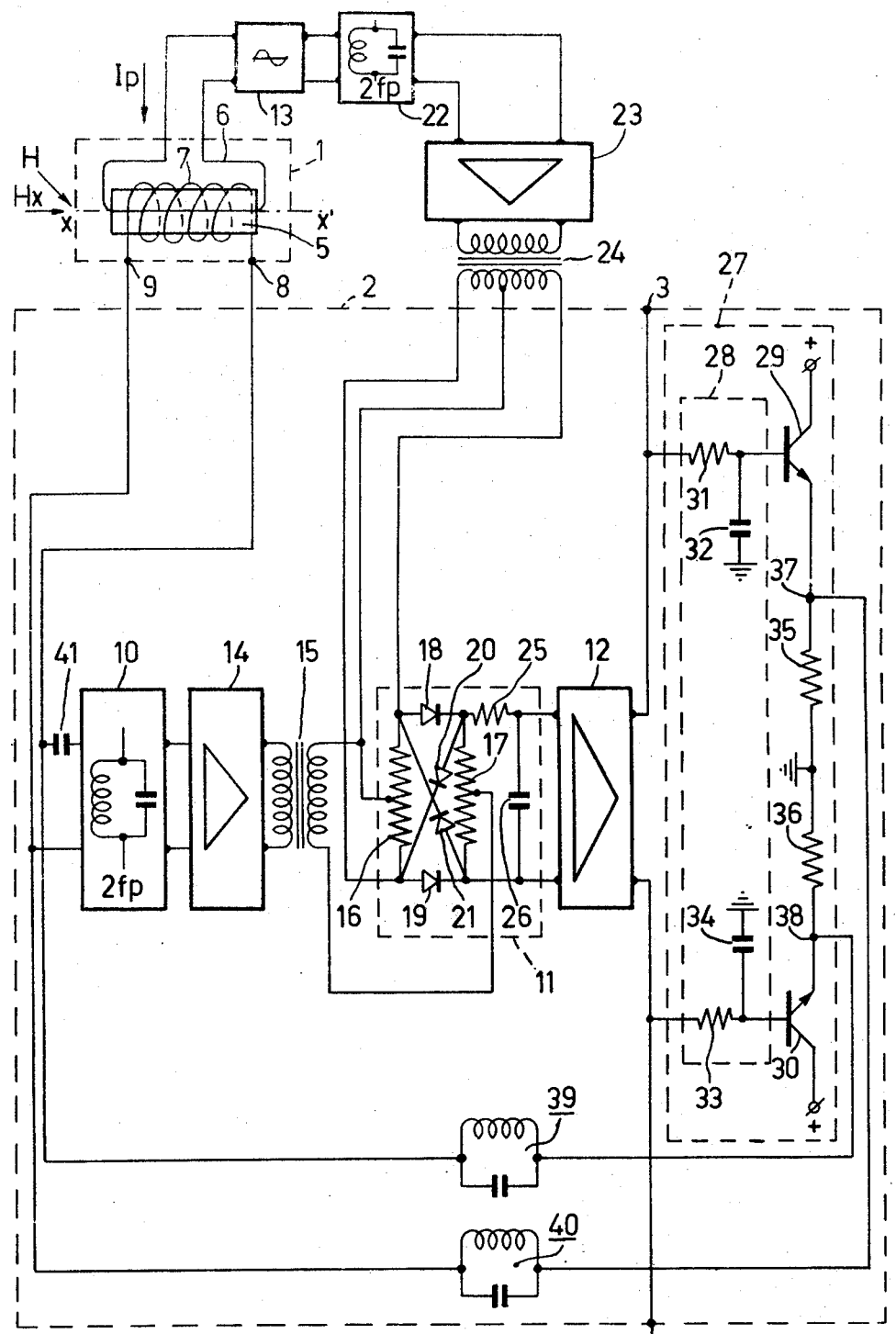

FIG. 1 shows a pick-up element 1 which indicates the variations of the permanent magnetic field H. This magnetic field is essentially caused by the earth's magnetic field. The vicinity of the steel mass constituting a vehicle causes a variation of the intensity and the direction of the magnetic field H at the area of the pick-up element, and hence a variation of the signal supplied by the pick-up element. FIG. 1 also shows the electronic circuits associated with the pick-up element, notably the device 2 for processing and amplifying the signal supplied by the pick-up element, with the exception of the pulseshaper which is to be connected to the output terminals 3 and 4 of the device 2 and which must supply a single pulse each time a vehicle passes by.

In accordance with the invention, the pick-up element 1 is an element of the type with orthogonal windings comprising an element of a ferromagnetic material 5 which is provided with a pump winding 6 which is supplied with a current Ip of a frequency $f_p$ which saturates the said material, and a signal winding 7 which is orthogonal to the pump winding. The device 2 for processing and amplifying the signal supplied by the pick-up element, connected to the output terminals 8, 9 of the signal winding, comprises a cascade connection of frequency selection means 10 for selecting an even harmonic of the frequency $f_p$ and a synchronous detector 11, the output signal of which, amplified by the symmetrical voltage amplifier 12, is applied to the terminals 3 and 4.

In the embodiment shown in FIG. 1, the ferromagnetic element 5 of the pick-up element is a tube which is made, for example, of sintered material of the type Ferroxcube. This tube is provided with a toroidal winding 6 which serves as the pump winding, the said winding comprising a given number of turns which are passed through the interior of the tube. This winding, symbolically represented by a single turn, is supplied by an oscillator 13 with the current $I_p$ of a frequency $f_p$, so that in the tube 5 a circular magnetic field is produced, the axis of which is formed by the axis $x\ x'$ of the tube. The tube 5 is further provided with a solenoid winding 7 which is arranged along the axis $x\ x'$ of the tube and which serves as the signal winding.

No signal is obtained at the terminals 8, 9 of the signal winding if the pick-up element is not exposed to any component of the outer magnetic field along the axis $x\ x'$ of the tube, whereas if this component is present, a signal is obtained at the terminals 8 and 9 which contains only even harmonics of the frequency $f_p$. If a vehicle passing near the pick-up element changes the intensity and the direction of the magnetic field H at the area of the pick-up element, the intensity and possibly the direction of the component $H_x$ along the axis $x\ x'$ of the tube are necessarily changed, so that a variation of the signal at the terminals 8, 9 of the signal winding is obtained.

In the device 2 for the analog processing of the signal supplied by the pick-up element, the second harmonic of the pump frequency $f_p$ is selected, within the selection circuit 10, diagrammatically shown in the form of an LC oscillatory circuit tuned to the frequency $2f_p$, a useful signal of the frequency $2f_p$ is obtained, the amplitude of which is proportional to the component Hx of the field H at the area of the pick-up element, its phase being inverted or not by 180° in accordance with the direction of this component on the axis $x\ x'$. This signal is amplified in the AC-amplifier 14 in which means for selecting the frequency $2f_p$ can be incorporated. The secondary winding of the output transformer 15 of this amplifier is connected to one input of the synchronous detector 11, i.e. to the relevant centre points of the resistors 16, 17. The synchronous detector is realized in known form as a diode bridge 18, 19, 20, 21. The reference signal of the frequency $2f_p$, feeding the second input of the synchronous detector, is obtained from the oscillator 13. The selection circuit 22, shown in the form of an oscillatory circuit tuned to the frequency $2f_p$, extracts the second harmonic from the signal supplied by the oscillator 13. This signal is amplified in the AC-amplifier 23, the output transformer 24 of which is shown. The center tapped secondary winding of the transformer 24 is connected to the second input of the synchronous detector, i.e. its ends and its centre tapping are connected to the ends and the centre tapping, respectively, of the resistor 16.

The detected voltage, obtained at the terminals of the resistor 16, is filtered by the resistor 25 and the capacitor 26. On the output terminals of the synchronous detector, connected to the terminals of the capacitor 26, a direct voltage is obtained whose amplitude and polarity are a reproduction of the strength and the direction of the component $H_x$ of the magnetic field H at the area of the pick-up element 1.

Figure 2:
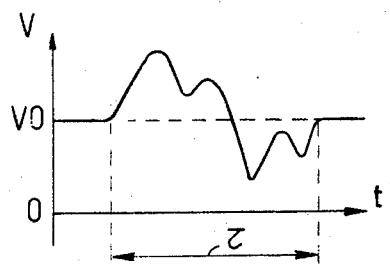
FIG. 2 shows a diagram of the signals obtained at the output of the detector of FIG. 1 upon the passage of a vehicle.

After amplification of this voltage, a voltage V is obtained between the output terminals 3, 4, this voltage being shown in FIG. 2 as a function of time.

In the absence of vehicles, a permanent voltage $V_o$ is obtained which is produced by the component of the permanent magnetic field. When a vehicle passes by, this voltage varies, the waveform being dependent on the geometry of the steel masses constituting the vehicles. Generally a change of the polarity with respect to the permanent voltage $V_o$ is observed. This is due to the fact that under the influence of the permanent magnetic field the vehicle behaves as a magnetic dipole which itself produces a magnetic field which, depending on the position of the vehicle with respect to the pick-up element, is added to or subtracted from the component of the said permanent magnetic field.

The advantages of the novel use, according to the invention, of a magnetometer of the kind with orthogonal windings for the detection of vehicles, are essentially due to the sensitivity of an instrument of this kind. In the vehicle detector according to the invention, this characteristic permits the reduction of the dimensions of the pick-up element while maintaining adequate sensitivity. For example, a pick-up element was realized by means of a ferrite tube dimensioned 2 × 4 × 50 mm. The toroidal winding comprised eighteen turns and the solenoid winding two hundred and thirty turns. A pick-up element of this kind can be readily constructed in the form of a robust element, for example, encapsulated in resin and insensitive to the external climatic conditions. It can be installed in or at the edge of a road in the most practical location, without its orientation being a decisive factor in the detection of vehicles.

In a practical embodiment of the detector the pump frequency $f_p$ was 20 kHz, and the power required for supplying the assembly of circuits shown in FIG. 1 was in the order of 3.5 watts.

In the system described thus far the useful signal which is supplied by the pick-up element in the absence of vehicles is not zero, and can vary slowly in time because the permanent magnetic field at the area of the pick-up element itself can vary slowly for reasons other than the passage of vehicles to be detected. This becomes apparent in a voltage $V_o$ (see FIG. 2) which changes in time, so that it becomes difficult to utilize the voltage variations caused by the passage of vehicles in a pulseshaper. A saturation of the electronic circuits can also occur.

In order to eliminate this drawback, the invention provides means for automatic neutralization of the permanent magnetic fields which render the output voltages of the device 2 practically equal to zero in the absence of vehicles, and which permit the detection of the passage of vehicles with proper sensitivity.

To achieve this end, the signal present on the output terminals 3 and 4 of the processing and amplifying device 2 is fed back to a solenoid winding of the pick-up element (the signal winding 7 in the example shown in FIG. 1) via the circuit 27, comprising a low-pass filter 28 and a symmetrical current amplifier, the active elements which are formed by the transistors 29 and 30.

The low-pass filter 28 is formed by two RC integrating networks having a large time constant (in the order of 5 to 25 seconds). One integrating network (resistor 31 and capacitor 32) is connected between the output terminal 3 and the base of the transistor 29 of the symmetrical current amplifier. The other integrating network, resistor 33 and capacitor 34, is connected between the output terminal 4 and the base of transistor 30 of the symmetrical current amplifier. The collectors of the two npn transistors 29 and 30 are connected to the positive pole of a DC supply source, the negative pole of which is grounded. The emitters of these two transistors are connected to ground via two identical resistors 35 and 36. The emitters of the two transistors 29 and 30 form the output terminals 37 and 38 of the symmetrical current amplifier. Each of the two transistors 29 and 30 can be an assembly of transistors connected in a "Darlington" configuration.

Due to the large time constant of the two integrating networks, the symmetrical outputs 37 and 38 of the current amplifier can only reproduce those voltages appearing between terminals 3 and 4 which vary only very slowly with time and which are the electrical images of the permanent magnetic fields at the area of the pick-up element. In contrast therewith, the outputs 37 and 38 will practically not reproduce voltages appearing between 3 and 4 which vary very quickly and which are electrical images of the quickly varying magnetic fields.

As a result, by connecting the two outputs 37, 38 of the current amplifier to a solenoid winding of the pick-up element (the signal winding 7 in the example shown in FIG. 1) such that the effect of the permanent magnetic fields at the location of the pick-up element is compensated for, a feedback loop is obtained which ensures neutralization of these permanent fields without exerting an appreciable effect on the quickly varying magnetic fields.

It is thus achieved that the voltage between the two output terminals 3 and 4 of the device reproduces the fast varying magnetic fields (passage of vehicles), and presents a value $V_o$ which is practically equal to zero for permanent magnetic fields.

The solenoid winding of the pick-up element used for neutralizing permanent magnetic fields can be a winding other than the signal winding 7. However, the solution where these two windings are combined as shown in FIG. 1 offers the advantage that the number of connection wires between the pick-up element and the circuits is reduced. In this case, the signal winding 7 thus has two functions: one function being the collection of the useful signal in the case of a variation of the field $H_x$ along the axis of the pick-up element in order to apply this useful signal to the input of the circuit 10 for selection of the frequency $2 f_p$, the other function being the neutralization of the permanent magnetic fields by means of the direct current supplied by the two output terminals 37 and 38 of the symmetrical amplifier. In order to ensure the decoupling of the two circuits thus connected to the signal winding 7, use is made of circuit elements 39, 40 and 41.

The elements 39 and 40, connected in series between the two wires of the feedback loop, are parallel resonant circuits which are tuned to the frequency $2 f_p$. They constitute suppression filters which allow passage of the direct current of the feedback loop, and which prevent the useful signal, having the frequency $2 f_p$, from reappearing at the two resistors 35 and 36 which are connected to the output of the symmetrical amplifier.

The element 41 is a capacitor which is connected in series with the input of the processing circuit of the useful signal. It constitutes a very small impedance with respect to the useful signal of the frequency $2 f_p$, and a very high impedance with respect to the direct current or the slowly varying current.

From the voltage V, supplied between the output terminals 3 and 4 of the device 2 for processing and amplifying the pick-up element signal, this voltage having a waveform as shown in FIG. 2 upon the passage of a vehicle, a single squarewave pulse must be obtained in a pulseshaper, the said pulse having substantially the same duration $\tau$ as that during which the voltage V is variable.

Because the amplitude, the shape and the duration $\tau$ of this voltage are dependent on the type and the speed of the passing vehicles, the realization of such a pulseshaper imposes problems, while the use of threshold circuits in the pulseshaper involves the risk of a plurality of pulses being generated upon the passage of a single vehicle.

Figure 3:
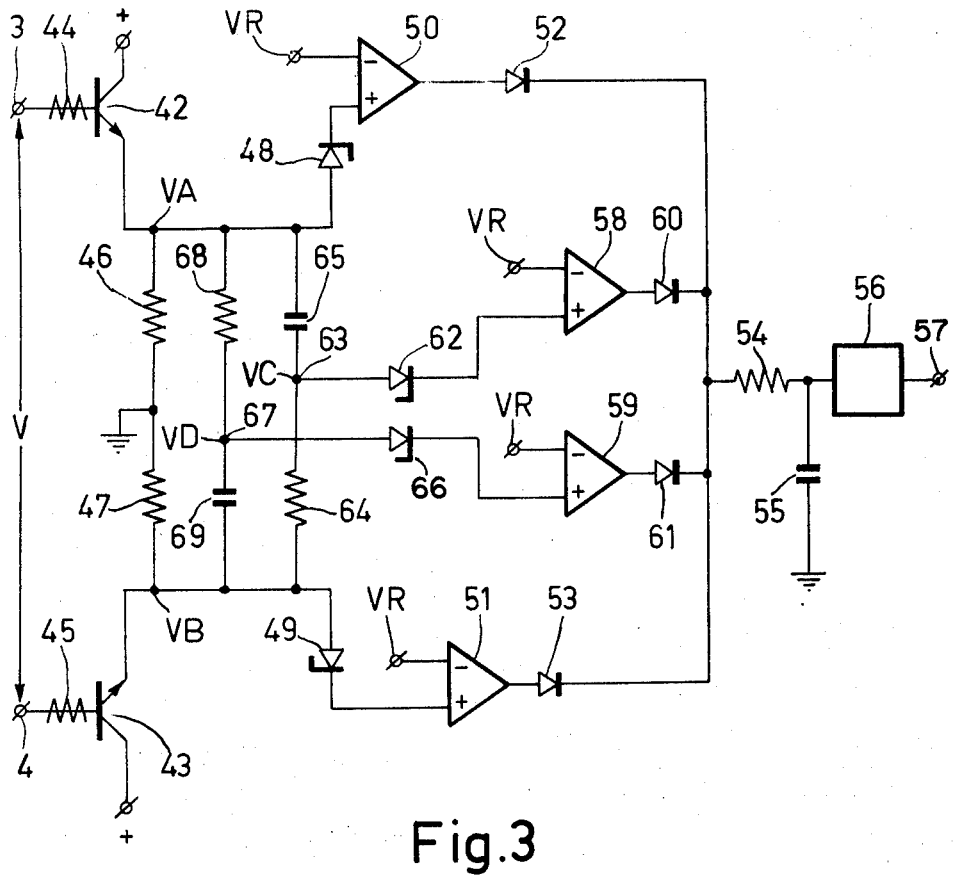
FIG. 3 shows the pulseshaper according to the invention.

The pulseshaper shown in FIG. 3 provides a solution to these problems.

This Figure shows the two output terminals 3 and 4 of the device 2 between which the voltage V is applied. In order to facilitate the description of the operation of the pulseshaper it is assumed that the voltage V, which is equal to zero in the absence of vehicles, is sinusoidal, as shown in FIG. 4a, upon the passage of a vehicle.

The two terminals 3 and 4 are connected to the base electrodes of the push-pull connected transistors 42 and 43, respectively, via the two identical resistors 44 and 45. The collectors of these transistors are connected to the positive pole of a direct voltage source, the negative pole of which is connected to ground. The emitters of transistors 42 and 43 are connected to ground via two identical resistors 46 and 47.

The emitters of the transistors 42, 43 are also connected, via Zener diodes 48, 49, to the input (+) of two differential amplifiers 50, 51 which are connected as comparison circuits. The input (−) of these comparison circuits is connected to a positive reference potential VR. The output of these two comparison circuits 50, 51 is connected by way of the two diodes 52, 53, to a terminal of the resistor 54, the other terminal of which is connected to a terminal of the capacitor 55 and to the input of an amplifying and limiting circuit 56. The other terminal of the capacitor 55 is connected to ground. The output 57 of the circuit 56 forms the output terminal of the pulseshaper.

Figure 4:
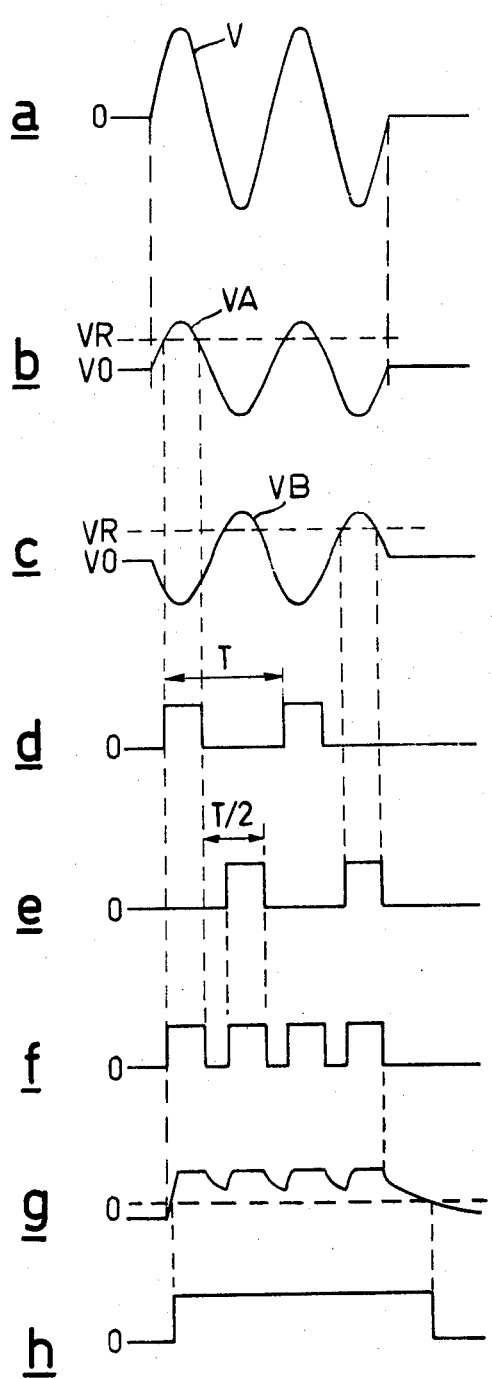
FIGS. 4 and 5 show signal diagrams illustrating the operation of the pulseshaper.

The operation of the circuit described thus far will be described with reference to the various diagrams of FIG. 4. In the diagrams 4b and 4c, the potentials VA and VB at the emitters of the transistors 42, 43 are denoted by solid lines. These potentials have a constant value $V_o$ for an input voltage V which is equal to zero. If this voltage V has the sinusoidal shape shown in FIG. 4a, the potentials VA and VB are sinusoidally varied in phase-opposition. If the potential VA and the reference potential VR, denoted by a broken line in FIG. 4b, are applied to each of its inputs, the comparison circuit 50 supplies at its output the pulses having a period T which are shown in FIG. 4d. In a similar manner, the pulses shown in FIG. 4e are obtained at the output of comparison circuit 51, the said pulses being phase-shifted one half period with respect to the pulses shown in FIG. 4d. Assuming that the capacitor 55 was disconnected, the pulses of FIG. 4f would be obtained at the input of the limiting circuit 56. The presence of this capacitor 55, however, ensures that at the input of the circuit 56 the signal shown in FIG. 4g, having voltage dips with minimum values unequal to zero at the areas where the voltage was zero in FIG. 4, is obtained. If the signal of FIG. 4g is limited to the level denoted by a broken line, i.e. below the said minimum values, a squarewave pulse as shown in FIG. 4h can be obtained at the output of the pulseshaper.

The pulseshaper described thus far has the drawback that, in order to be sure that a single pulse as shown in FIG. 4h is obtained each time a vehicle passes by, it is necessary that the discharge time constant of the capacitor 55 be high so that the dips shown in FIG. 4g will never reach the limiting level. It must actually be taken into account that for vehicles which move at a very slow speed the duration of these dips is long. However, if the discharge time constant of the capacitor 55 is high, the end of the pulse according to FIG. 4h is delayed so that two vehicles which are close together are liable to generate only one single pulse.

In order to eliminate this drawback, the pulseshaper shown in FIG. 3 also comprises two comparison circuits 58, 59, the outputs of which are connected to the resistor 54 by way of the diodes 60 and 61. The input (−) of these comparison circuits is connected to the positive reference potential VR. The input (+) of the comparison circuit 58 is connected, by way of the Zener diode 62, to the terminal 63 which is common to the resistor 64 and the capacitor 65, the two other terminals of elements 64 and 65 being connected to the emitters of the transistors 43 and 42, respectively. The input (+) of the comparison circuit 59 is connected, by way of the Zener diode 66, to the terminal 67 which is common to the resistor 68 and the capacitor 69, the two other terminals of elements 68 and 69 being connected to the emitters of the transistors 42 and 43, respectively.

The operation of the complete circuit of FIG. 3 will now be described with reference to the diagrams of FIG. 5.

In FIG. 5a the sinusoidal variations of the potentials VA and VB are represented by a solid line and a broken line, respectively, the said potentials being in phase-opposition.

The two RC-networks 64, 65 and 68, 69 form two phase-shifting networks and by a suitable choice of the elements forming these networks it can be achieved that the potentials VC and VD of the points 63 and 67 are in phase-opposition with respect to each other, and in quadrature with respect to the potentials VA and VB. In FIG. 5b the sinusoidal variations of the potentials VC and VD are represented by a solid line and a broken line, respectively. After comparison with the positive reference potential VR, the potentials VA and VB produce, at the output of the comparison circuits 50 and 51, the pulses PA and PB which are denoted in FIG. 5c by solid lines and broken lines, respectively.

Similarly, after comparison with the potential VR, the potentials VC and VD produce, at the output of the comparison circuits 58 and 59, the pulses PC and PD which are denoted in FIG. 5d by solid lines and broken lines, respectively.

It will be obvious that even in the absence of the capacitor 55 a pulse of constant amplitude, as shown in FIG. 5e, is obtained at the input of the limiting circuit 56, the duration of said pulse not exceeding the duration of the voltage variations at the input of the pulseshaper.

Figure 5:
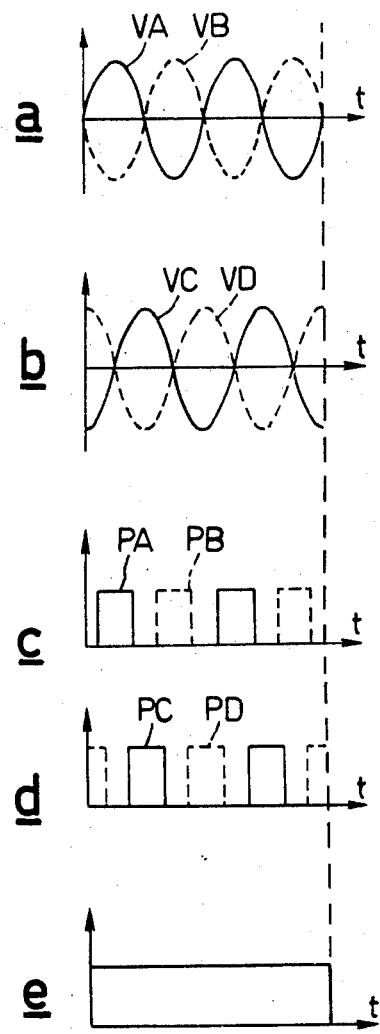

The variable signal at the input of the pulseshaper is not as sinusoidal as shown in FIG. 4a in practice, and the operation of the pulseshaper is not as ideal as shown in the diagrams of FIG. 5. However, at the output of the four comparison circuits pulses are obtained which are phase-shifted with respect to each other so that a signal of substantially constant amplitude can be obtained at the input of the limiting circuit 56 by means of a capacitor 55 having a low value.

Depending upon the waveform of the variable signals upon the passage of vehicles, it is alternatively possible to use only a single phase-shifting network or to use a more complex phase-shifting network.

What is claimed is:

1. A device for detecting mobile ferromagnetic masses along a path exposed to a permanent magnetic field comprising, a pick-up element for producing a signal indicating the local variations of said permanent magnetic field caused by the passage of said ferromagnetic masses, said pick-up element including an element which is made of a ferromagnetic material and which is provided with a pump winding and with a signal winding positioned orthogonal to the pump winding, means for supplying a current of a frequency $f_p$ to the pump winding so as to saturate the ferromagnetic material, a device for processing the signal supplied by the signal winding of the pick-up element comprising a cascade connection of a circuit for selecting an even harmonic of the frequency $f_p$ and a synchronous detector which provides a time varying output signal during passage of a ferromagnetic mass that constitutes the output signal of the processing device, a pulseshaper circuit responsive to said output signal for deriving a single pulse at its output upon the passage of each ferromagnetic mass, and a negative feedback circuit for coupling the output signal of the processing device to a solenoid winding of the pick-up element, and wherein the pulseshaper circuit includes phase-shifter means responsive to the output signal received from the synchronous detector for deriving at first and second terminals first and second voltages in phase opposition, first and second threshold level discriminators having first and second inputs coupled to said first and second terminals, respectively, each of said discriminators deriving at its output terminal voltage pulses of the same polarity but phase shifted relative to one another, and means for combining the voltage pulses at the output terminals of said first and second discriminators.

2. A detector as claimed in claim 1 further comprising first and second RC phase shift circuits connected between said first and second terminals to derive at third and fourth terminals third and fourth voltages in phase opposition to one another and in quadrature to said first and second voltages, third and fourth threshold level discriminators having first and second inputs coupled to said third and fourth terminals, respectively, each of said third and fourth discriminators deriving at its output terminal voltage pulses of the same polarity but phase shifted relative to one another, and means for combining the voltage pulses at the output terminals of said third and fourth discriminators with the voltage pulses at the output terminals of said first and second discriminators.

3. A system for detecting the movement of an object exhibiting ferromagnetic properties along a path exposed to a magnetic field comprising, magnetic field sensing means disposed adjacent said path and responsive to a variation of said magnetic field caused by the movement of said object, said sensing means comprising an element composed of a ferromagnetic material having a pump winding and a signal winding positioned orthogonally to one another, means for applying an alternating current to the pump winding of a magnitude to saturate the ferromagnetic element, means for processing the signal supplied by the signal winding of the sensing means to derive an output signal that varies with said supplied signal, said processing means including a frequency filter tuned to a even harmonic of the pump frequency, and a pulse-shaper network responsive to said alternating output signal and including phase-shift means for deriving first and second out of phase voltages determined by said alternating output signal, and means responsive to the first and second voltages for deriving pulse-shaped output signals of the same polarity whenever the respective first and second voltages exceed a given voltage level.

4. A system as claimed in claim 3 wherein said phase-shift means further comprise means responsive to one of said first and second voltages for deriving a third voltage out of phase with said first and second voltages and said pulse-shaped signal deriving means includes means responsive to said third voltage for deriving further pulse-shaped output signals of the same polarity as the pulse-shaped signals derived in response to said first and second voltages whenever said third voltage exceeds a given voltage level, and means for combining said pulse-shaped signals to produce a single output pulse.

5. A system as claimed in claim 3 further comprising means for neutralizing the magnetic field comprising a feedback circuit coupling the output signal of the processing means to a solenoid winding of the field sensing means in a sense to counteract the signal voltage produced at said signal winding in the absence of a ferromagnetic object.

6. A system as claimed in claim 5 wherein said feedback circuit includes low pass filter means having a long time constant in the order of one second or more.

7. A system as claimed in claim 6 wherein said low pass filter means comprises first and second RC integrating networks symmetrically connected to the output terminals of the signal processing means to derive essentially DC neutralizing currents for the solenoid winding of the field sensing means.

8. A system as claimed in claim 3 wherein said signal processing means includes a synchronous detector having a first input coupled to receive the output signal from said frequency filter and a second input, and means for applying an alternating signal of said even harmonic frequency to the second input of the detector, said synchronous detector supplying the alternating output signal of the signal processing means.

9. A device for detecting mobile ferromagnetic masses along a path exposed to a permanent magnetic field comprising, a pick-up element for producing a signal indicating the local variations of said permanent magnetic field caused by the passage of said ferromagnetic masses, said pick-up element including an element which is made of a ferromagnetic material and which is provided with a pump winding and with a signal winding positioned orthogonal to the pump winding, means for supplying a current of a frequency $f_p$ to the pump windng so as to saturate the ferromagnetic material, a device for processing the signal supplied by the signal winding of the pick-up element comprising a cascade connection of a circuit for selecting an even harmonic of the frequency $f_p$ and a synchronous detector which provides a time varying output signal during passage of a ferromagnetic mass that constitutes the output signal of the processing device a pulseshaper circuit responsive to said output signal for deriving a single pulse at its output upon the passage of each ferromagnetic mass, a negative feedback circuit for coupling the output signal of the processing device to the signal winding of the pick-up element, said feedback circuit comprising a low-pass filter and a symmetrical current amplifier, a limiting circuit, and wherein the pulseshaper circuit includes means for phase shifting the output signal received from the synchronous detector for deriving a plurality of voltages which are phase-shifted with respect to each other, means for applying said plurality of phase shifted voltages to respective inputs of a plurality of threshold-voltage discriminators, each discriminator including means for applying voltage pulses of the same polarity to the input of the limiting circuit.

10. A detector as claimed in claim 9 wherein the inputs of two of said discriminators are connected to receive first and second of said phase-shifted voltages which follow the variations of the input voltage of the pulseshaper circuit but which are in phase-opposition with respect to each other, and the inputs of the other discriminators are connected to points in the phase-shifting, means at which the voltages are out of phase with one another.

11. A system for detecting the movement of an object exhibiting ferromagnetic properites along a path exposed to a magnetic field comprising, magnetic field sensing means disposed adjacent said path and responsive to a variation of said magnetic field caused by the movement of said object, said sensing means comprising an element composed of a ferromagnetic material having a pump winding and a signal winding positioned orthogonally to one another, means for applying an alternating current to the pump winding of a magnitude to saturate the ferromagnetic element, means for processing the signal supplied by the signal winding of the sensing means to derive an output signal that varies with said supplied signal, said processing means including a frequency filter tuned to an even harmonic of the pump frequency, means coupled to the output of the processing means and responsive to a variation in the output signal caused by movement of said object along said path for producing at its output a single pulse-type signal for each passing ferromagnetic object, and a negative feedback circuit coupling the output signal of the processing means to a solenoid winding of the field sensing means in a sense to counteract the signal voltage produced at said signal winding in the absence of a ferromagnetic object, and wherein said pulse-type signal producing means includes means responsive to said output signal for deriving first and second out of phase voltages, means responsive to said first and second voltages for producing first and second voltage pulses of the same polarity but phase shifted relative to one another, and means for combining said first and second voltage pulses to produce a single output pulse for each passing ferromagnetic object.

12. A system as claimed in claim 11 wherein said feedback circuit includes a low pass filter.

13. A device for detecting mobile ferromagnetic masses along a path exposed to a permanent magnetic field comprising, a pick-up element for producing a signal indicating the local variations of said permanent magnetic field caused by the passage of said ferromagnetic masses, said pick-up element including an element which is made of a ferromagnetic material and which is provided with a pump winding and with a signal winding positioned orthogonal to the pump winding, means for supplying a current of a frequency $f_p$ to the pump winding so as to saturate the ferromagnetic material, a device for processing the signal supplied by the signal winding of the pick-up element comprising a cascade connection of a circuit for selecting an even harmonic of the frequency $f_p$ and a synchronous detector which provides a time varying output signal during passage of a ferromagnetic mass that constitutes the output signal of the processing device, a pulseshaper circuit responsive to said output signal for deriving a single pulse at its output upon the passage of each ferromagnetic mass, and wherein said pulseshaper circuit includes threshold means responsive to said output signal for deriving first and second out of phase pulse-type signals of the same polarity, and means for combining said first and second pulse-type signals to produce a single output pulse signal for each passing ferromagnetic mass.

14. A detecting device as claimed in claim 13 wherein said pulseshaper circuit includes means for providing a fixed reference voltage that establishes a single operating threshold level for the pulseshaper circuit during the passage of each ferromagnetic mass.

* * * * *

UNITED STATES PATENT AND TRADEMARK OFFICE
CERTIFICATE OF CORRECTION

PATENT NO. : 3,944,912
DATED : March 16, 1976
INVENTOR(S) : YVES ANGEL ET AL

It is certified that error appears in the above–identified patent and that said Letters Patent are hereby corrected as shown below:

col. 1, line 34, cancel "intefering" and insert -- interfering --;

col. 3, line 5, cancel "the" and insert -- a --; cancel "a" and insert -- the --;

col. 4, line 28, cancel the comma (,);

line 54, after "elements" insert -- of --;

IN THE CLAIMS claim 3, line 15, change "a" (2nd occur.) to -- an --;

claim 9, line 11, change "windng" to -- winding --;

line 18, after "device" insert a comma (,);

claim 10, line 8, cancel the comma (,);

Signed and Sealed this

Fifth Day of October 1976

[SEAL]

Attest:

RUTH C. MASON
Attesting Officer

C. MARSHALL DANN
Commissioner of Patents and Trademarks